(12) United States Patent
Chen et al.

(10) Patent No.: US 11,184,999 B2
(45) Date of Patent: Nov. 23, 2021

(54) CHARGING COLUMN

(71) Applicant: DELTA ELECTRONICS, INC., Taoyuan (TW)

(72) Inventors: Chieh-Kai Chen, Taoyuan (TW); Kai-Hung Huang, Taoyuan (TW)

(73) Assignee: DELTA ELECTRONICS, INC., Taoyuan (TW)

(*) Notice: Subject to any disclaimer, the term of this patent is extended or adjusted under 35 U.S.C. 154(b) by 140 days.

(21) Appl. No.: 16/737,752

(22) Filed: Jan. 8, 2020

(65) Prior Publication Data
US 2021/0100138 A1 Apr. 1, 2021

(30) Foreign Application Priority Data
Oct. 1, 2019 (TW) ................................ 108135471

(51) Int. Cl.
*H05K 7/20* (2006.01)
*H02J 7/00* (2006.01)
(Continued)

(52) U.S. Cl.
CPC .......... *H05K 7/20872* (2013.01); *B60L 53/18* (2019.02); *B60L 53/302* (2019.02); *H02J 7/0042* (2013.01); *H05K 7/20272* (2013.01)

(58) Field of Classification Search
CPC ............ H05K 7/20872; H05K 7/20272; H02J 7/0042; B60L 53/18; B60L 53/302
(Continued)

(56) References Cited

U.S. PATENT DOCUMENTS 5,909,099 A 6/1999 Watanabe et al.
6,831,837 B2 * 12/2004 Chang .................. G11B 33/126
206/307
(Continued)

FOREIGN PATENT DOCUMENTS

CN 1186366 A 7/1998
CN 208919526 U 5/2019
(Continued)

OTHER PUBLICATIONS

Anonymous: "Q. Safe Range Quick Couplings", Jan. 1, 2016, XP055718650, Retrieved from the Internet: URL: https://www.manuli-hydraulics.com/wp-content/uploads/2017/08/q.safe_web.pdf pp. 6-7 [retrieved on Jul. 28, 2020].
(Continued)

*Primary Examiner* — Sun J Lin
(74) *Attorney, Agent, or Firm* — Chun-Ming Shih; HDLS IPR Services

(57) ABSTRACT

A charging column includes an equipment box having a control equipment and a delivery pipelines, an isolated docking box disposed outside the equipment box, a power device and a cooling pipeline. An interior of the isolated docking box is isolated from an interior of the equipment box. A first pair of joints are connected to the delivery pipelines and electrodes are electrically connected to the control equipment inside the isolated docking box. The power device is connected to the isolated docking box and the electrodes therein. The cooling pipeline connected to the isolated docking box includes a second pair of joints for engaging with the first pair of joints. Any coolant leakage and falling off objects can be retained inside the isolated docking box, thereby protecting the control equipment from damages.

19 Claims, 9 Drawing Sheets

(51) Int. Cl.
  *B60L 53/302* (2019.01)
  *B60L 53/18* (2019.01)
(58) Field of Classification Search
  USPC .......................................................... 320/107
  See application file for complete search history.

(56) References Cited

U.S. PATENT DOCUMENTS

| | | | | |
|---|---|---|---|---|
| 8,033,542 | B2 * | 10/2011 | Bisone et al. | B65H 31/06 |
| | | | | 271/179 |
| 8,136,454 | B2 * | 3/2012 | Barbee et al. | B61C 3/00 |
| | | | | 105/50 |
| 8,677,908 | B2 * | 3/2014 | Kanda | B60L 50/61 |
| | | | | 105/35 |
| 2019/0016225 | A1 | 1/2019 | Zies et al. | |
| 2020/0171967 | A1 | 6/2020 | Gohla-Neudecker et al. | |

FOREIGN PATENT DOCUMENTS

| | | |
|---|---|---|
| DE | 102011000573 A1 | 8/2012 |
| DE | 102017213938 A1 | 10/2018 |

OTHER PUBLICATIONS

Office Action dated May 19, 2020 of the corresponding Taiwan patent No. I710306.
Search Report dated Aug. 6, 2020 of the corresponding European patent application No. 20151722.4.

* cited by examiner

CHARGING COLUMN

BACKGROUND OF THE DISCLOSURE

Field of the Disclosure

The technical field relates to a charging column, in particular, to a charging column with an isolated docking box.

Description of Related Art

Currently existing electric vehicles are equipped with a large amount of batteries. To prevent long period of waiting time for charging, vehicle charging columns are generally designed to have a greater output power in order to perform fast charging on electric vehicles. However, large output power tends to cause the wires and cables to generate great amount of heat during charging. Consequently, vehicle charging columns are, in generally, equipped with pipelines for cooling equipment. The pipelines at least pass through the charging gun, and when it is considered necessary, the pipelines can further pass through other heat generating parts of the equipment.

For currently existing charging columns, the component parts are typically received inside one identical space, and the pipelines are connected via conventional joints. During the removal and repair, as the pipelines are removed and separated, the coolant inside the pipelines tends to leak out, and leakage may still occur during the assembly installation due to improper sealing. The coolant leaked out may spread outward inside the outer casing such that the electrical equipment inside the outer casing can be damaged. Furthermore, the pipelines are connected to the charging gun; therefore, it is necessary to also replace the pipelines connected between the charging gun and the water pump when the charging gun is replaced.

In view of above, the inventor seeks to overcome the aforementioned drawbacks associated with the currently existing technology after years of research and development along with the utilization of academic theories, which is also the objective of the development of the present disclosure.

SUMMARY OF THE DISCLOSURE

The present disclosure provides a charging column equipped with an isolated docking box.

The present disclosure provides a charging column, comprising an equipment box, an isolated docking box, a power device and a cooling pipeline. The equipment box comprises a control equipment and a delivery pipeline received therein. The isolated docking box is disposed outside the equipment box and includes an interior isolated from an interior of the equipment box. The isolated docking box further comprises at least one pair of first pair of joints connected to the delivery pipelines and a plurality of electrodes arranged therein and electrically connected to the control equipment. The power device is connected to the interior of the isolated docking box and further connected to the plurality of electrodes. The cooling pipeline is connected to the interior of the isolated docking box and comprises at least one pair of second pair of joints connected to each one of the first pair of joints correspondingly.

For the charging column of the present disclosure, any one of the first pair of joints and the second pair of joints correspondingly connected thereto is a pair of anti-leakage male joints, and the other one thereof is a pair of corresponding anti-leakage female joints. The pair of anti-leakage male joints comprises a male connecting pipe having a male plug and a first elastic member penetrating therethrough; one end the male connecting pipe used for connecting to the anti-leakage female joints is configured to form a male interface thereon, and the first elastic member abuts against an inner wall of the male connecting pipe and the male plug in order to push the male plug to block the male interface; the pair of anti-leakage female joints comprises a female connecting pipe having a female interface connected to the male connecting pipe; the female connecting pipe includes a female plug secured thereto, a movably arranged sleeve and a second elastic member arranged to penetrate therethrough; the female plug is isolated from an inner wall of the female connecting pipe; the second elastic member abuts against the inner wall of the female connecting pipe and the sleeve in order to push the sleeve toward the female interface for blocking the sleeve between the female plug and the female connecting pipe. Accordingly, when the male connecting pipe is inserted into the female connecting pipe, the male connecting pipe pushes the sleeve away from the female plug, and the female plug pushes the male plug away from the male interface.

For the charging column of the present disclosure, the power device comprises a charging gun, and the power device can also further comprise a power supply device. A portion of the cooling pipeline is located inside the power supply device in order to cool the power supply device. The cooling pipeline includes a drive pump and a water tank connected thereto. The drive pump and the water tank are located inside the isolated docking box. A portion of the cooling pipeline is located inside the power device in order to cool the power device.

In addition, the present disclosure provides a charging column, comprising an equipment box, two isolated docking boxes, a power supply device and a charging gun. The equipment box comprises a control equipment and a delivery pipeline received therein. Each one of the isolated docking boxes is disposed outside the equipment box and includes an interior isolated from an interior of the equipment box; each one of the isolated docking boxes further comprises at least one pair of first pair of joints connected to the delivery pipeline and a plurality of electrodes arranged therein and electrically connected to the control equipment; the two isolated docking boxes are respectively configured to be an input docking box and an output docking box. The power device is arranged inside the input docking box and connected to the plurality of electrodes inside the input docking box. The charging gun is connected from an exterior of the output docking box to an interior of the output docking box and is further connected to the electrodes inside the output docking box. The power supply device and the charging gun correspondingly include a cooling pipeline arranged thereon; each one of the cooling pipelines is connected to an interior of the correspondingly isolated docking box, and each one of the cooling pipelines includes at least one pair of second pair of joints correspondingly connected to each one of the first pair of joints.

For the charging column of the present disclosure, any one of the first pair of joints and the second pair of joints correspondingly connected thereto is a pair of anti-leakage male joints, and the other one thereof is a pair of corresponding anti-leakage female joints. The pair of anti-leakage male joints comprises a male connecting pipe having a male plug and a first elastic member penetrating therethrough; one end the male connecting pipe used for connecting to the pair of anti-leakage female joints is configured to form a male interface thereon, and the first elastic member abuts against an inner wall of the male connecting pipe and the male plug in order to push the male plug to block the male interface; the pair of anti-leakage female joints comprises a female connecting pipe having one end connected to the male connecting pipe formed of a female interface; the female connecting pipe includes a female plug secured thereto, a movably arranged sleeve and a second elastic member arranged to penetrate therethrough; the female plug is isolated from an inner wall of the female connecting pipe; the second elastic member abuts against the inner wall of the female connecting pipe and the sleeve in order to push the sleeve toward the female interface in order to be blocked between the female plug and the female connecting pipe. Accordingly, when the male connecting pipe is inserted into the female connecting pipe, the male connecting pipe pushes the sleeve away from the female plug, and the female plug pushes the male plug away from the male interface.

For the charging column of the present disclosure, a portion of the cooling pipeline is located inside the power device in order to cool the power supply device. The cooling pipeline includes a drive pump and a water tank connected thereto. The drive pump and the water tank are located inside the input docking box.

For the charging column of the present disclosure, a portion of the cooling pipeline is located inside the charging gun in order to cool the charging gun.

The charging column of the present disclosure is equipped with an isolated docking box, and the first pair of joints, the second pair of joints and the electrodes thereof are isolated from the equipment box by the isolated docking box. Accordingly, it is able to isolate and retain any coolant and falling off objects within the isolated docking box during the wiring and installation of the power device, thereby protecting the control equipment inside the equipment box from any damages.

DETAILED DESCRIPTION OF THE DISCLOSURE

Figure 1:
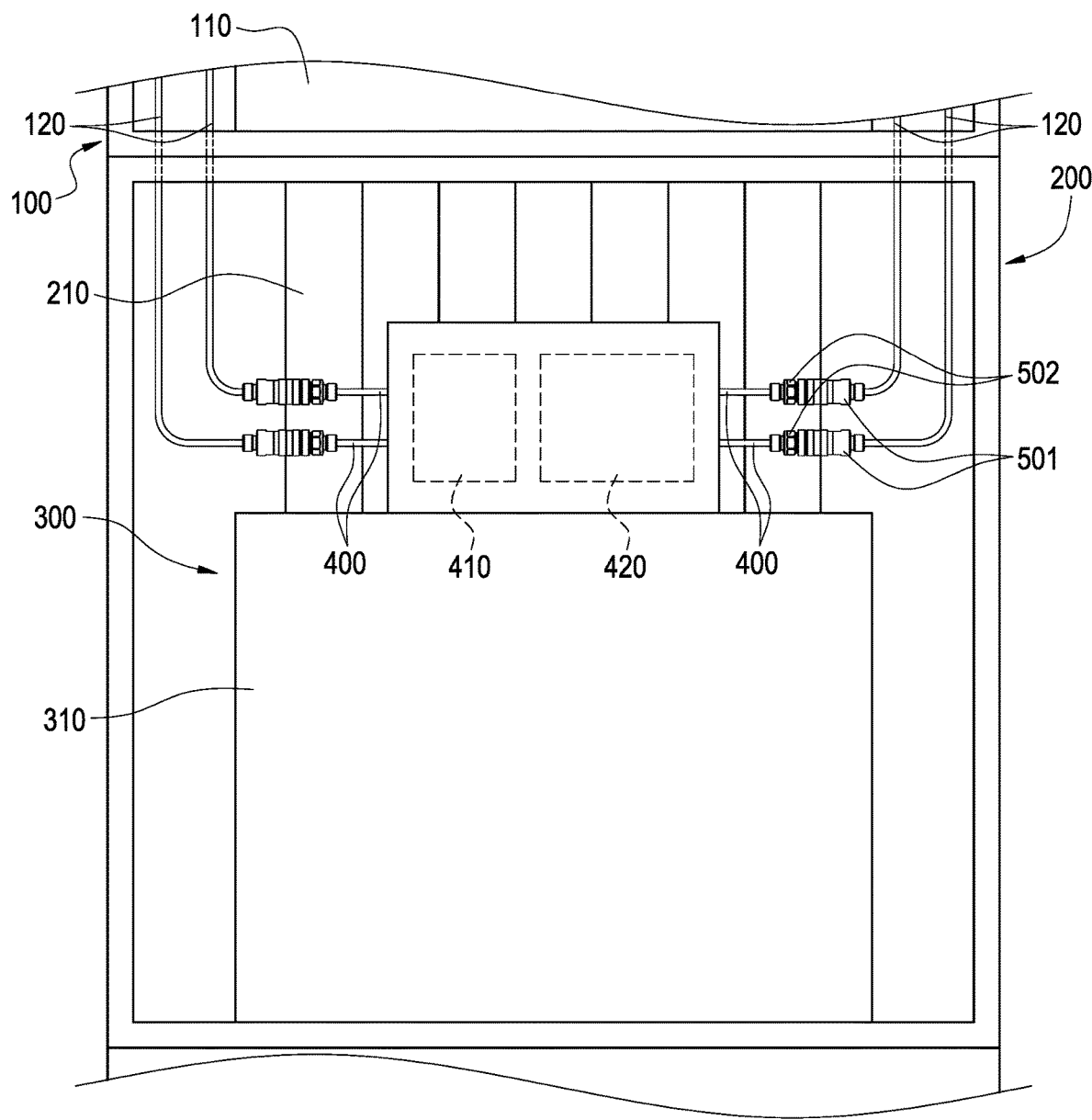
FIGS. 1 and 2 are schematic views of the charging column according to the first exemplary embodiment of the present disclosure.
Figure 2:
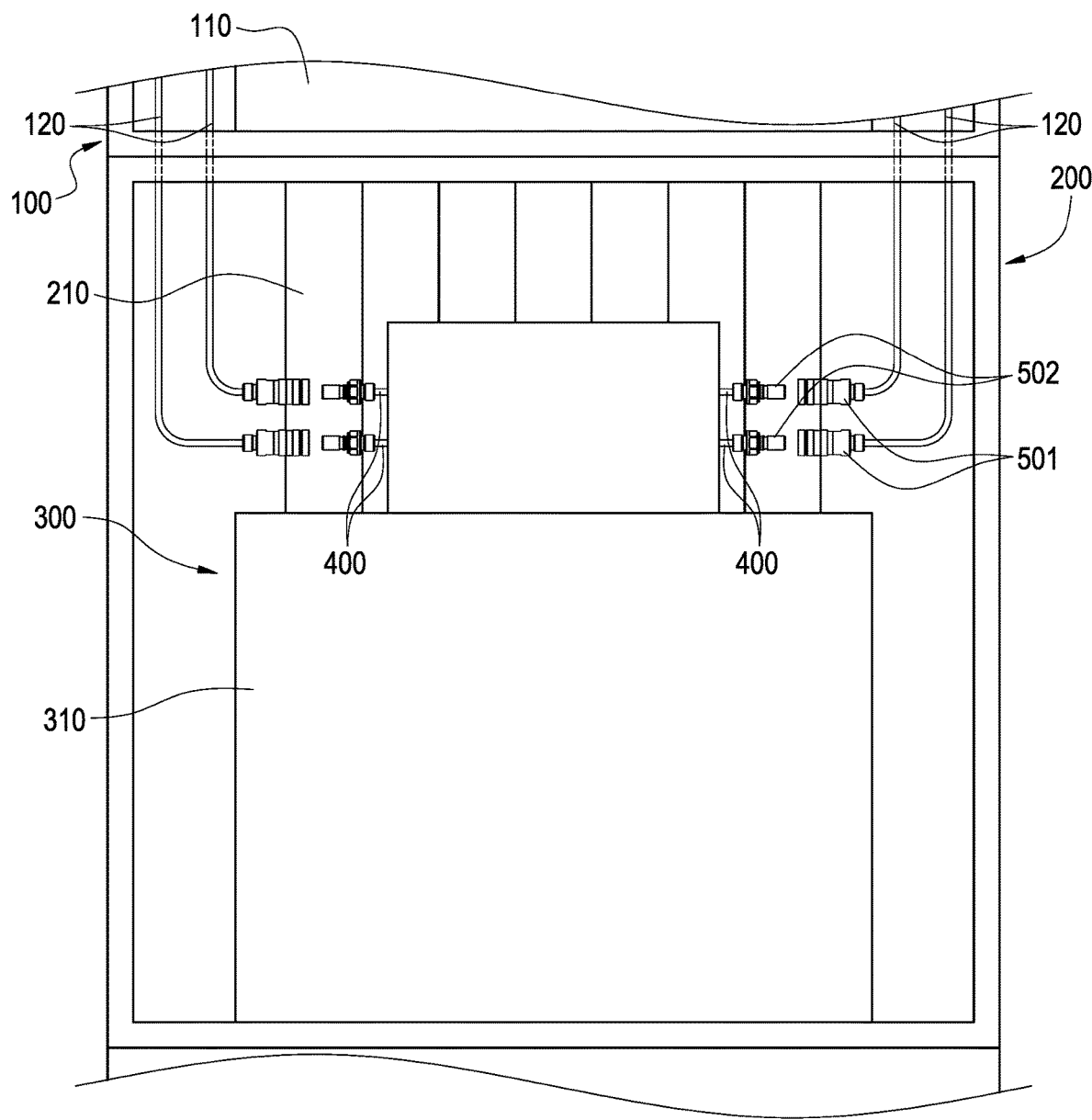

Please refer to FIG. 1 and FIG. 2, showing a charging column according to a first exemplary embodiment of the present disclosure, comprising an equipment box 100, an isolated docking box 200, a power device 300 and a cooling pipeline 400.

The equipment box 100 includes a control equipment 110 and a delivery pipeline 120 received therein. The isolated docking box 200 is disposed outside the equipment box 100 and includes an interior isolated from an interior of the equipment box 100. The isolated docking box 200 comprises at least one pair of first pair of joints 501. Each of the first pair of joints 501 is connected to the delivery pipeline 120. The isolated docking box 200 includes a plurality of electrodes 210, and each of the electrodes 210 is electrically connected to the control equipment 110.

The power device 300 is connected to the interior of the isolated docking box 200 and is further connected to the plurality of electrodes 210. To be more specific, the power device 300 can be received inside the isolated docking box 200 and can be directly or indirectly connected to the electrode 210. The power device 300 can be a device for transmitting power to the control equipment 110 or a device for inputting power from the control equipment 110. Accordingly, the control equipment 110 inside the equipment box 100 is able to control the power transmission of the power device 300.

As shown in FIG. 1, the cooling pipeline 400 is connected to the interior of the isolated docking box 200 and the cooling pipeline 400 includes at least one pair of second pair of joints 502 connected to each one of the first pair of joints 501 correspondingly. The cooling pipeline 400 can be completely received inside the isolated docking box 200, or it can also penetrate into the isolated docking box 200 from the external of the isolated docking box 200.

Figure 3:
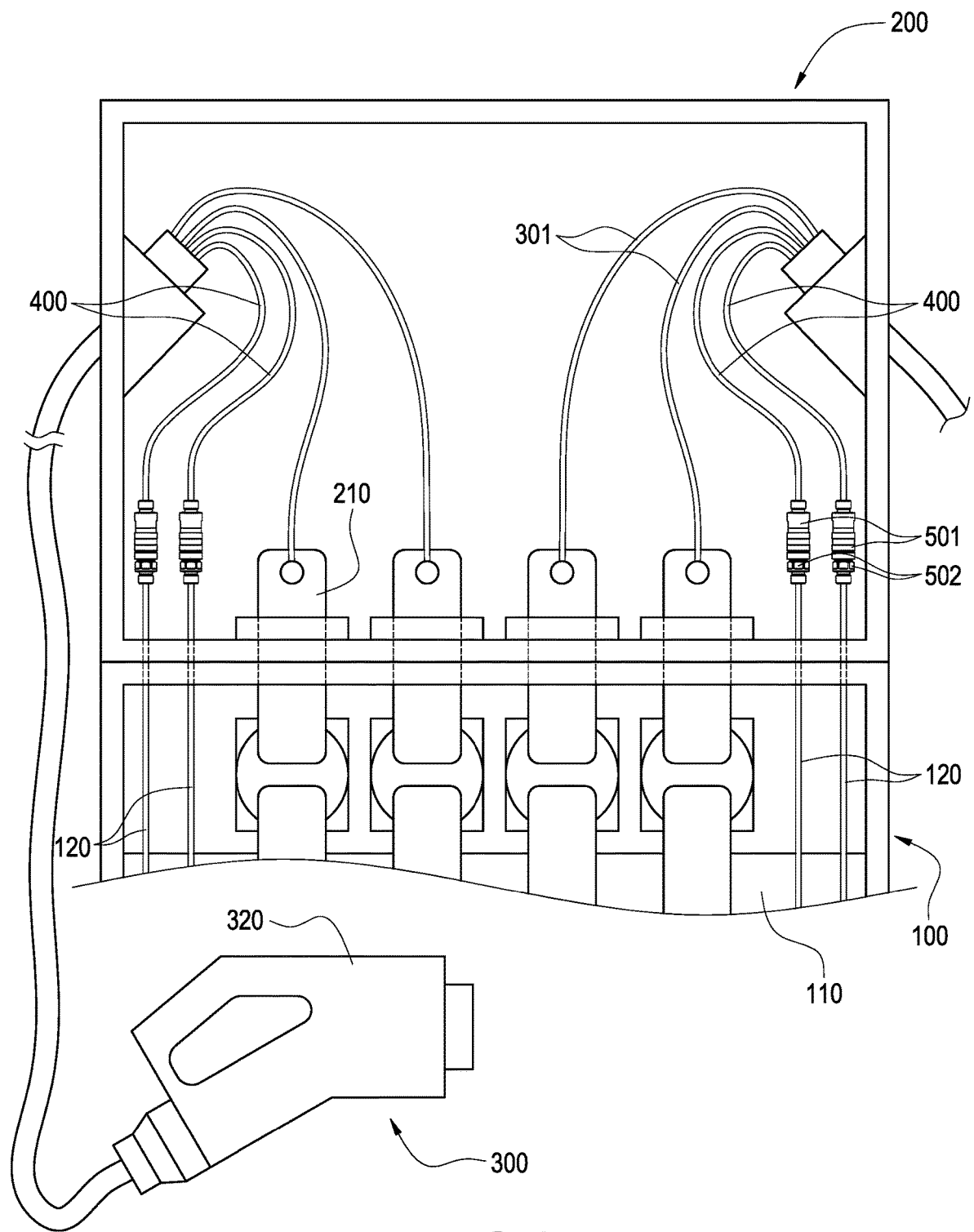
FIGS. 3 and 4 are schematic views showing another configuration of the charging column according to the first exemplary embodiment of the present disclosure.
Figure 4:
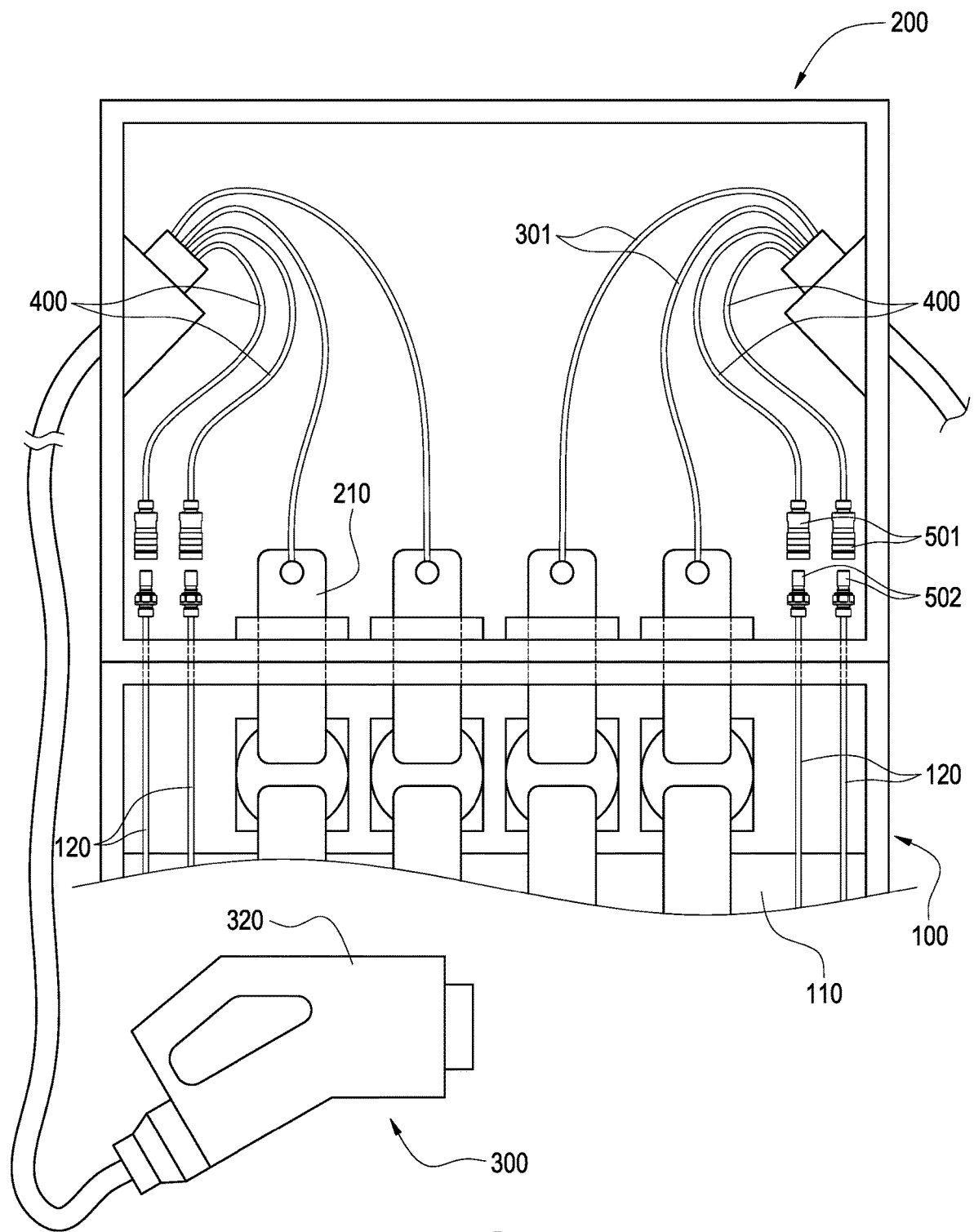

In the first exemplary embodiment, the power device 300, as shown in FIG. 1 and FIG. 2, comprises a power supply device 310. The power supply device 310 can be used to transmit power to the control equipment 110. A portion of the cooling pipeline 400 can also be selectively arranged inside the power supply device 310 in order to cool the power supply device 310. The cooling pipeline 400 can be connected with a drive pump 410 and a water tank 420 connected thereto. In addition, preferably, the drive pump 410 and the water tank 400 can be located inside the isolated docking box 200. Nevertheless, it can be understood that they can also be arranged outside the isolated docking box 200 and connected to the interior of the isolated docking box 200 via the cooling pipeline 400. Moreover, the configuration of the power device 300 is not limited to such type only. FIG. 3 and FIG. 4 shows another configuration of the power device 300 such that it can be located outside the isolated docking box 200 and connected further to the electrode 210 via the conductive circuit 301 penetrating into the isolated docking box 200. To be more specific, the power device 300 comprises a charging gun 320, and the charging gun 320 is used for inserting into a vehicle. In addition, the charging gun 320 receives power from the control equipment 110 in order to further transmit power to the vehicle. A portion of the cooling pipeline 400 is arranged inside the charging gun 320, such that when a vehicle is charged through the charging gun 320, the cooling pipeline 400 is able to cool the charging gun 320.

Figure 5:
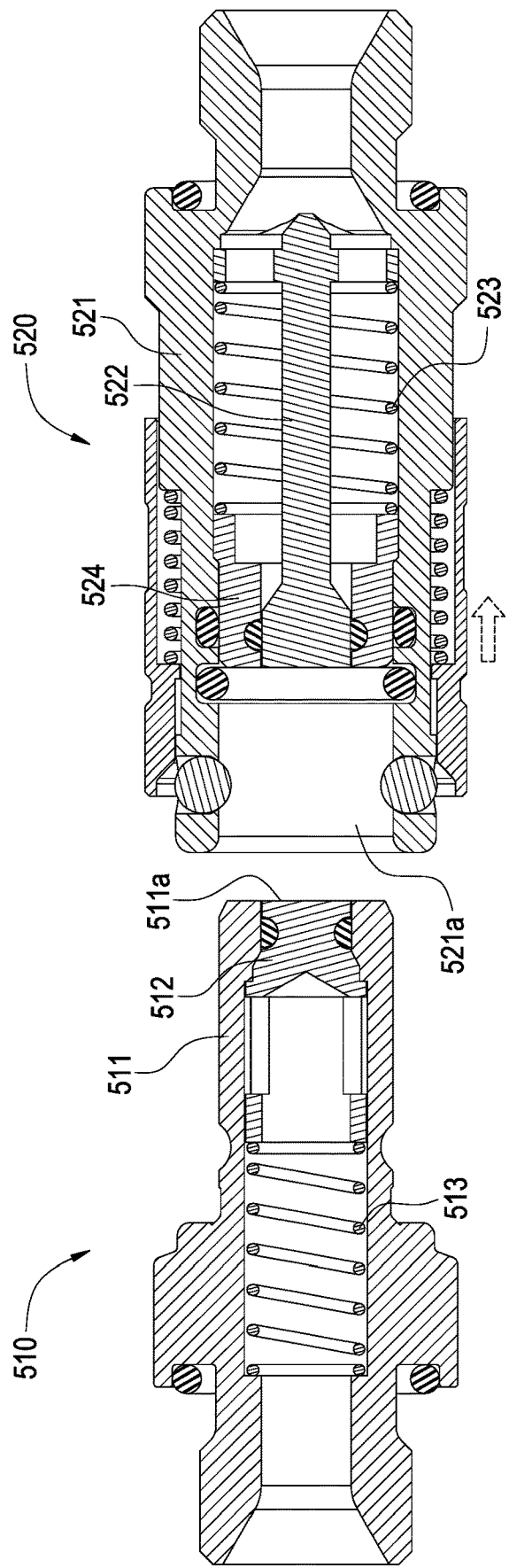
FIG. 5 is a schematic view showing the anti-leakage male joints disengaged from the anti-leakage female joints according to the first exemplary embodiment of the present disclosure.
Figure 6:
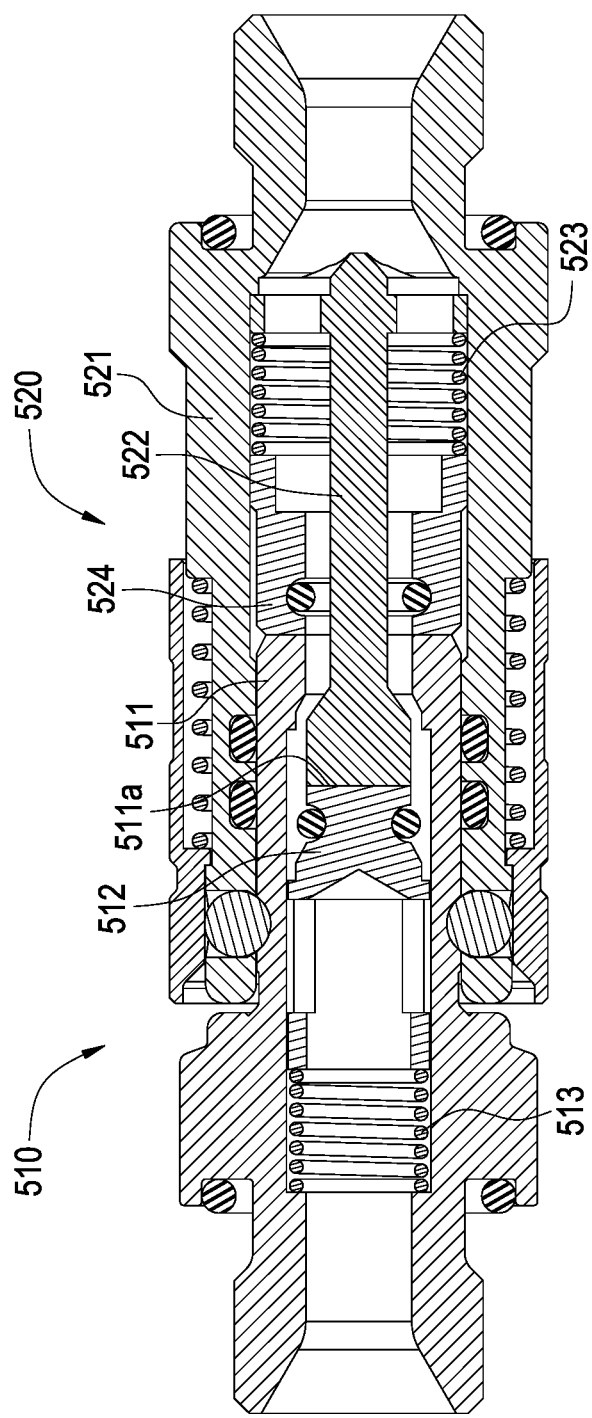
FIG. 6 is a schematic view showing the anti-leakage male joints engaged with the anti-leakage female joints according to the first exemplary embodiment of the present disclosure.

One of the aforementioned first pair of joints 501 and the second pair of joints 502 correspondingly connected thereto is a pair of anti-leakage male joints 510 as shown in FIG. 5 and FIG. 6, and the other one thereof is a pair of corresponding anti-leakage female joints 520 as shown in FIG. 5 and FIG. 6. Please refer to FIG. 5 and FIG. 6. When the pair of anti-leakage male joints 510 is disengaged from the pair of anti-leakage female joints 520, they are respectively under the sealed state in order to prevent the coolant in the cooling pipeline 400 or the delivery pipeline 120 to leak out from the pair of anti-leakage male joints 510 or the pair of anti-leakage female joints 520. After the pair of anti-leakage male joints 510 is engaged with the pair of anti-leakage female joints 520, it is able to allow the cooling pipeline 400 to connect with the delivery pipeline 120. The structures of the pair of anti-leakage male joints 510 and the pair of anti-leakage female joints 520 are described in detail as follows.

The pair of anti-leakage male joints 510 comprises a male connecting pipe 511, and the male connecting pipe 511 includes a male plug 512 and a first elastic member 513 penetrating therethrough. One end the male connecting pipe 511 used for connecting to the pair of anti-leakage female joints 520 is configured to form a male interface 511a thereon, and the other end of the male connecting pipe 511 is pre-connected to the cooling pipeline 400 or the delivery pipeline 120. The first elastic member 513 abuts against an inner wall of the male connecting pipe 511 and the male plug 512 in order to push the male plug 512 to block the male interface 511a.

The pair of anti-leakage female joints 520 comprises a female connecting pipe 521, and the female connecting pipe 521 includes one end which is female interface 521a connected to the male connecting pipe 511, and the other end of the female connecting pipe 521 is pre-connected to the delivery pipeline 120 or the cooling pipeline 400. The female connecting pipe 521 includes a female plug 522 secured thereto, a movably arranged sleeve 524 and a second elastic member 523 arranged to penetrate therethrough. The female plug 522 is isolated from an inner wall of the female connecting pipe 521. The second elastic member 523 abuts against the inner wall of the female connecting pipe 521 and the sleeve 524 in order to push the sleeve 524 toward the female interface 521a for blocking the sleeve 524 between the female plug 522 and the female connecting pipe 521. When the male connecting pipe 511 is inserted into the female connecting pipe 521, the male connecting pipe 511 pushes the sleeve 524 away from the female plug 522, and the female plug 522 pushes the male plug 512 away from the male interface 511a. Accordingly, the male connecting pipe 511 is connected to the female connecting pipe 521.

Figure 7:
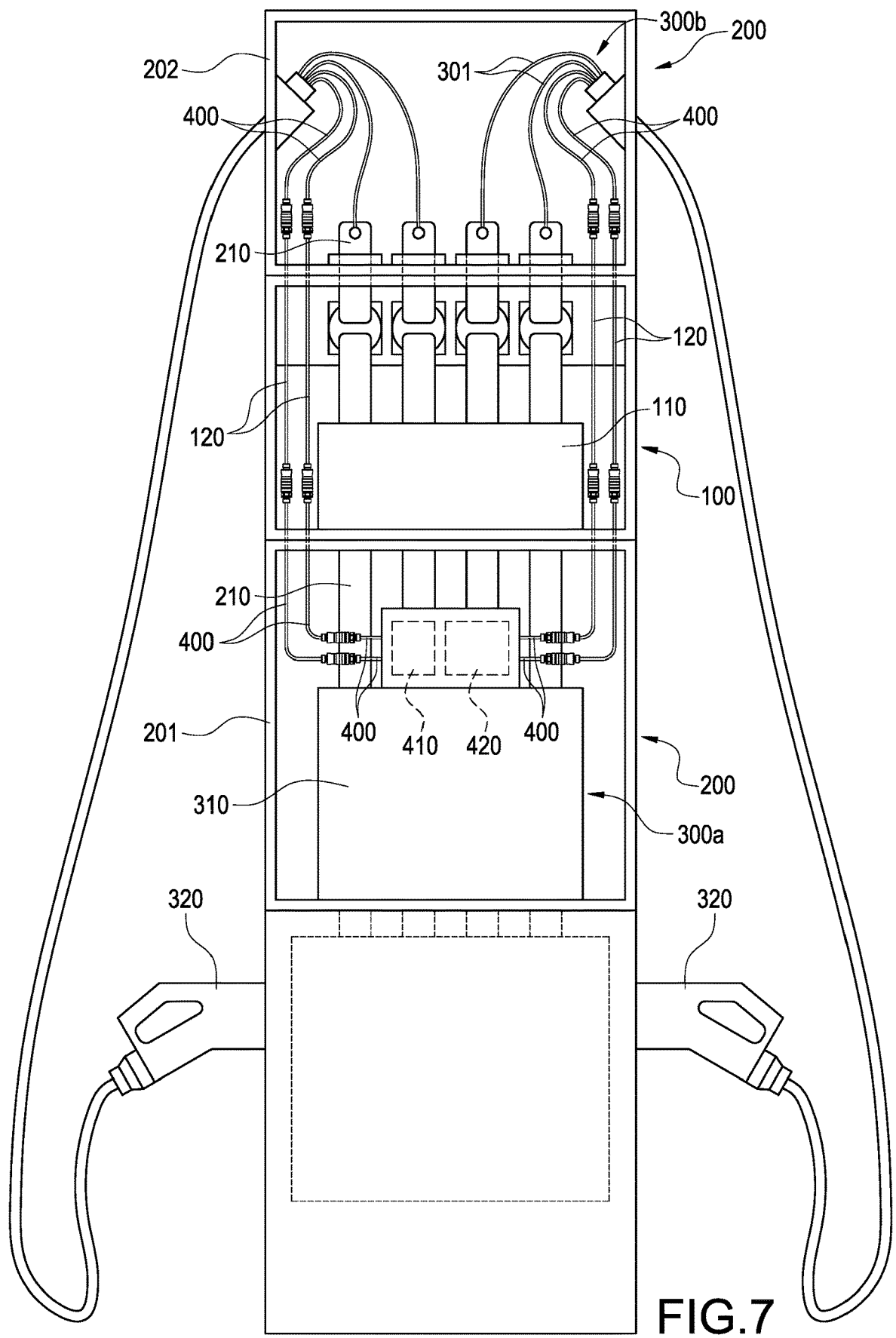
FIGS. 7 to 9 are schematic views of the charging column according to the second exemplary embodiment of the present disclosure.
Figure 8:
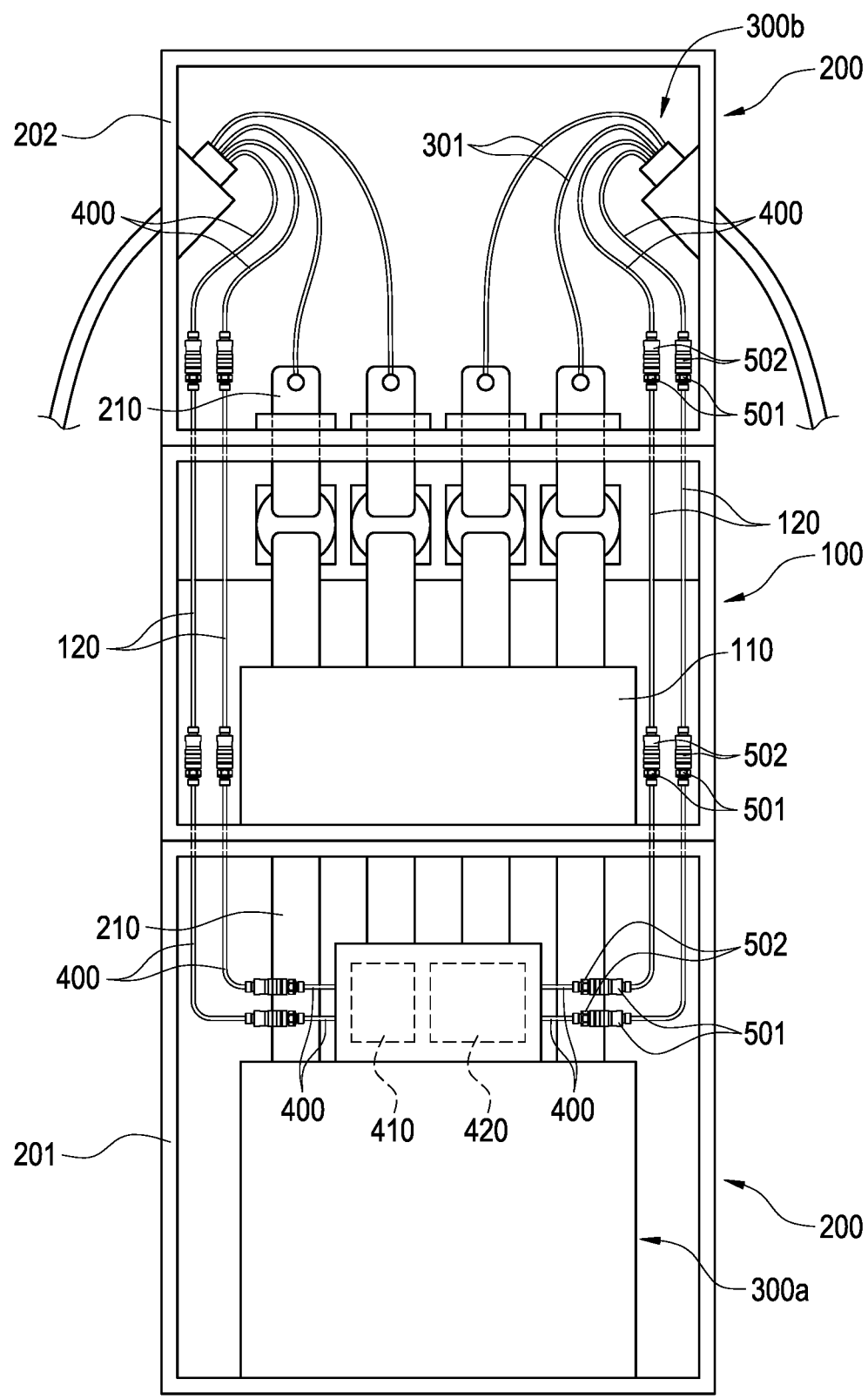
Figure 9:
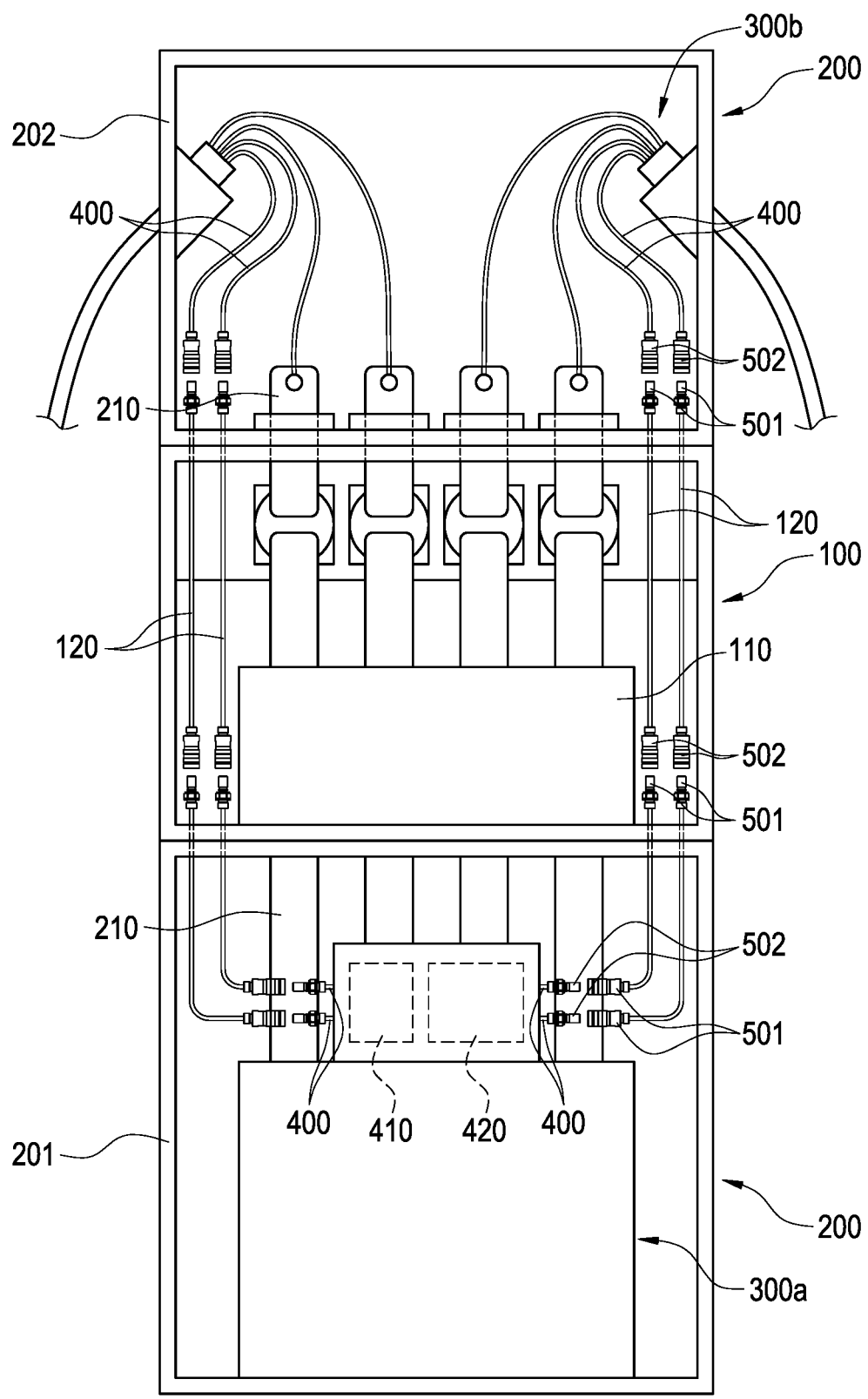

Please refer to FIG. 7 to FIG. 9, showing a charging column according to a first exemplary embodiment of the present disclosure, comprising an equipment box 100, two isolated docking boxes 200 and two sets of power devices 300a/300b of different configuration. The equipment box 100 comprising a control equipment 110 and a delivery pipeline 120 received therein.

Each one of the two isolated docking boxes 200 is disposed outside the equipment box 100 and each of the isolated docking boxes 200 includes an interior isolated from an interior of the equipment box 100. Each one of the isolated docking boxes 200 further comprises at least one pair of first pair of joints 501 connected to the delivery pipeline 120, and each one of the isolated docking boxes 200 includes a plurality of electrodes 210 arranged therein and electrically connected to the control equipment 110. The two isolated docking boxes 200 are respectively configured to be an input docking box 201 and an output docking box 202.

One of the sets of power devices 300a comprises a power supply device 310, and it is arranged inside the input docking box 201 and connected to the electrodes 210 inside the input docking box 201. A portion of the cooling pipeline 400 is located inside the power supply device 310 in order to cool the power supply device 310. The cooling pipeline 400 includes a drive pump 410 and a water tank 420 connected thereto. The water tank 420 is provided for storing the coolant, and the drive pump is provided for driving the coolant to circulate and flow inside the cooling pipe 400 and the delivery pipe 120. The drive pump 410 and the water tank 420 can be arranged inside the input docking box 201, or they can also be arranged outside the input docking box 201 and further connected to the interior of the input docking box 201 via the cooling pipeline 400.

According to another configuration of the power device 300b, it comprises at least one charging gun 320. In an exemplary embodiment, the power device 300b preferably comprises two sets of identical charging guns 320; however, the present disclosure is not limited to the quantity of the charging gun 320. Each charging gun 320 is connected to the interior of the output docking box 202 from the external of the output docking box 202 and is further connected to the electrodes 210 inside the output docking box 202. A portion of the cooling pipeline 400 is located inside the charging gun 320 in order to cool the charging gun 320.

The corresponding power supply device 310 and the charging gun 320 are respectively arranged with a cooling pipeline 400. Each cooling pipeline 400 is connected to the interior of each corresponding isolated docking box 200, and each cooling pipeline 400 includes at least one pair of second pair of joints The power supply device 310 and the charging gun 320 correspondingly include a cooling pipeline 400 arranged thereon. Each one of the cooling pipelines 400 is connected to an interior of the correspondingly isolated docking box 200, and each one of the cooling pipelines 400 includes at least one pair of second pair of joints 502 correspondingly connected to each one of the first pair of joints 501. Any one of the first pair of joints 501 and the second pair of joints 502 correspondingly connected thereto is a pair of anti-leakage male joints 510, and the other one thereof is a pair of corresponding anti-leakage female joints 520. The structures of the pair of anti-leakage male joints 510 and the pair of anti-leakage female joints 520 are identical to the ones described in the first exemplary embodiment and as shown in FIG. 4 to FIG. 5; therefore, details thereof are omitted hereafter.

The charging column of the present disclosure includes the isolated docking box 200, and its first pair of joints 501, the second pair of joints 502 and the electrodes 210 use the isolated docking box 200 for isolation from the equipment box 100. Accordingly, during removal or installation and connection of the power device 300, any leakage of coolant and falling objects (such as screws for fastening the conductive circuit 301 and the electrodes 210) from the delivery pipeline 120 or the cooling pipeline 400 can be retained inside the isolated docking box 200 in order to protect the control equipment 110 inside the equipment box 100 from damages. The first pair of joints 501 and the second pair of joints 502 can use anti-leakage joints such that during the disengagement of the delivery pipeline 120 and the cooling pipeline 400, large amount of leakage of coolant can be prevented. Moreover, during the replacement of the power device 300, it is necessary to replace the cooling pipeline 400 only without the need to replace the delivery pipeline 120 together; consequently, the consumable cost for maintenance can be reduced.

The above describes the preferable and feasible exemplary embodiments of the present disclosure for illustrative purposes only, which shall not be treated as limitations of the scope of the present disclosure. Any equivalent changes and modifications made in accordance with the scope of the claims of the present disclosure shall be considered to be within the scope of the claim of the present disclosure.

What is claimed is:

1. A charging column, comprising:
   an equipment box comprising a control equipment and a delivery pipeline received therein;
   an isolated docking box disposed outside the equipment box and having an interior isolated from an interior of the equipment box; the isolated docking box further comprising a pair of first pair of joints connected to the delivery pipeline and a plurality of electrodes arranged therein and electrically connected to the control equipment;
   a power device connected to the interior of the isolated docking box and further connected to the plurality of electrodes; and
   a cooling pipeline connected to the interior of the isolated docking box and comprising a pair of second pair of joints connected to each one of the first pair of joints correspondingly.

2. The charging column according to claim 1, wherein any one of the first pair of joints and the second pair of joints correspondingly connected thereto is a pair of anti-leakage male joints, and the other one thereof is a pair of corresponding anti-leakage female joints.

3. The charging column according to claim 2, wherein the pair of anti-leakage male joints comprises a male connecting pipe having a male plug and a first elastic member penetrating therethrough; one end the male connecting pipe used for connecting to the pair of corresponding anti-leakage female joints is configured to form a male interface thereon, and the first elastic member abuts against an inner wall of the male connecting pipe and the male plug in order to push the male plug to block the male interface; the pair of corresponding anti-leakage female joints comprises a female connecting pipe having a female interface connected to the male connecting pipe; the female connecting pipe includes a female plug secured thereto, a sleeve movably arranged and a second elastic member arranged to penetrate therethrough; the female plug is isolated from an inner wall of the female connecting pipe; the second elastic member abuts against the inner wall of the female connecting pipe and the sleeve in order to push the sleeve toward the female interface for blocking the sleeve between the female plug and the female connecting pipe;
   wherein when the male connecting pipe is inserted into the female connecting pipe, the male connecting pipe pushes the sleeve away from the female plug, and the female plug pushes the male plug away from the male interface.

4. The charging column according to claim 1, wherein the power device comprises a charging gun.

5. The charging column according to claim 1, wherein the power device comprises a power supply device.

6. The charging column according to claim 5, wherein the cooling pipeline includes a drive pump connected thereto.

7. The charging column according to claim 6, wherein the drive pump is located inside the isolated docking box.

8. The charging column according to claim 5, wherein the cooling pipeline includes a water tank connected thereto.

9. The charging column according to claim 8, wherein the water tank is located inside the isolated docking box.

10. The charging column according to claim 1, wherein a portion of the cooling pipeline is located inside the power device in order to cool the power device.

11. A charging column, comprising:
    an equipment box comprising a control equipment and a delivery pipeline received therein;
    two isolated docking boxes respectively disposed outside the equipment box and each isolated docking box having an interior isolated from an interior of the equipment box; said each isolated docking boxes further comprising a first pair of joints connected to the delivery pipeline and a plurality of electrodes arranged therein and electrically connected to the control equipment, the two isolated docking boxes respectively configured to be an input docking box and an output docking box;
    a power device arranged inside the input docking box and connected to the plurality of electrodes inside the input docking box; and
    a charging gun connected from an exterior of the output docking box to an interior of the output docking box and further connected to the plurality of electrodes inside the output docking box;
    wherein the power device and the charging gun respectively includes a corresponding cooling pipeline arranged thereon; each one of the cooling pipelines is connected to an interior of a correspondingly isolated docking box, and each one of the cooling pipelines includes a second pair of joints correspondingly connected to each one of the first pair of joints.

12. The charging column according to claim 11, wherein any one of the first pair of joints and the second pair of joints correspondingly connected thereto is a pair of anti-leakage male joints, and the other one thereof is a pair of corresponding anti-leakage female joints.

13. The charging column according to claim 12, wherein the pair of anti-leakage male joints comprises a male connecting pipe having a male plug and a first elastic member penetrating therethrough; one end the male connecting pipe used for connecting to the pair of corresponding anti-leakage female joints is configured to form a male interface thereon, and the first elastic member abuts against an inner wall of the male connecting pipe and the male plug in order to push the male plug to block the male interface; the pair of corresponding anti-leakage female joints comprises a female connecting pipe having a female interface connected to the male connecting pipe; the female connecting pipe includes a female plug secured thereto, a sleeve movably arranged and a second elastic member arranged to penetrate therethrough; the female plug is isolated from an inner wall of the female connecting pipe; the second elastic member abuts against the inner wall of the female connecting pipe and the sleeve in order to push the sleeve toward the female interface for blocking the sleeve between the female plug and the female connecting pipe;
    wherein when the male connecting pipe is inserted into the female connecting pipe, the male connecting pipe pushes the sleeve away from the female plug, and the female plug pushes the male plug away from the male interface.

14. The charging column according to claim 11, wherein a portion of the cooling pipeline is located inside the power device in order to cool a power supply device.

15. The charging column according to claim 14, wherein the cooling pipeline includes a drive pump connected thereto.

16. The charging column according to claim 15, wherein the drive pump is located inside the input docking box.

17. The charging column according to claim 14, wherein the cooling pipeline includes a water tank connected thereto.

18. The charging column according to claim 17, wherein the water tank is located inside the input docking box.

19. The charging column according to claim 11, wherein a portion of the cooling pipeline is located inside the charging gun in order to cool the charging gun.

\* \* \* \* \*